(12) United States Patent
Shafer et al.

(10) Patent No.: US 7,773,296 B2
(45) Date of Patent: *Aug. 10, 2010

(54) ULTRA-BROADBAND UV MICROSCOPE IMAGING SYSTEM WITH WIDE RANGE ZOOM CAPABILITY

(75) Inventors: David R. Shafer, Fairfield, CT (US); Yung-Ho Chuang, Cupertino, CA (US); Bin-Ming Benjamin Tsai, Saratoga, CA (US)

(73) Assignee: KLA-Tencor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/231,693

(22) Filed: Sep. 5, 2008

(65) Prior Publication Data
US 2009/0080065 A1 Mar. 26, 2009

Related U.S. Application Data

(63) Continuation of application No. 10/958,242, filed on Oct. 4, 2004, now Pat. No. 7,423,805, which is a continuation of application No. 10/282,592, filed on Oct. 29, 2002, now Pat. No. 6,801,357, which is a continuation of application No. 09/571,109, filed on May 15, 2000, now Pat. No. 6,483,638, which is a continuation-in-part of application No. 09/046,814, filed on Mar. 24, 1998, now Pat. No. 6,064,517, which is a continuation-in-part of application No. 08/908,247, filed on Aug. 7, 1997, now Pat. No. 5,999,310, which is a continuation-in-part of application No. 08/681,528, filed on Jul. 22, 1996, now Pat. No. 5,717,518.

(51) Int. Cl.
*G02B 15/14* (2006.01)
(52) U.S. Cl. ............... 359/354; 359/351; 359/355; 359/356; 359/357; 359/380

(58) Field of Classification Search ............... 359/351, 359/354–357, 364–366, 676, 422, 432, 728–730, 359/379–380
See application file for complete search history.

(56) References Cited

U.S. PATENT DOCUMENTS

| 4,800,269 | A | * | 1/1989 | Horikawa | 250/234 |
|---|---|---|---|---|---|
| 4,971,428 | A | * | 11/1990 | Moskovich | 359/366 |
| 5,014,707 | A | * | 5/1991 | Schwarz et al. | 600/476 |
| 5,031,976 | A | * | 7/1991 | Shafer | 359/355 |
| 5,148,314 | A | * | 9/1992 | Chen | 359/642 |
| 5,452,090 | A | * | 9/1995 | Progler et al. | 356/401 |
| 5,488,229 | A | * | 1/1996 | Elliott et al. | 250/492.2 |

(Continued)

*Primary Examiner*—Lee Fineman
(74) *Attorney, Agent, or Firm*—Smyrski Law Group, A P.C.

(57) ABSTRACT

An ultra-broadband ultraviolet (UV) catadioptric imaging microscope system with wide-range zoom capability. The microscope system, which includes a catadioptric lens group and a zooming tube lens group, has high optical resolution in the deep UV wavelengths, continuously adjustable magnification, and a high numerical aperture. The system integrates microscope modules such as objectives, tube lenses and zoom optics to reduce the number of components, and to simplify the system manufacturing process. The preferred embodiment offers excellent image quality across a very broad deep ultraviolet spectral range, combined with an all-refractive zooming tube lens. The zooming tube lens is modified to compensate for higher-order chromatic aberrations that would normally limit performance.

23 Claims, 7 Drawing Sheets

U.S. PATENT DOCUMENTS 5,717,518 A * 2/1998 Shafer et al. ................ 359/357
5,999,310 A * 12/1999 Shafer et al. ................ 359/351
6,801,357 B2 * 10/2004 Shafer et al. ................ 359/354
7,423,805 B2 * 9/2008 Shafer et al. ................ 359/354

* cited by examiner though both lens elements 108' and 109' provides the same
ULTRA-BROADBAND UV MICROSCOPE IMAGING SYSTEM WITH WIDE RANGE ZOOM CAPABILITY This application is a continuation of U.S. patent application Ser. No. 10/958,242, entitled "Ultra-Broadband UV Microscope Imaging System with Wide Range Zoom Capability," filed on Oct. 4, 2004 now U.S Pat. No. 7,423,805, which is a continuation of U.S. patent application Ser. No. 10/282,592, entitled "Ultra-Broadband UV Microscope Imaging System with Wide Range Zoom Capability," now U.S. Pat. No. 6,801,357, filed on Oct. 29, 2002, which is a continuation of U.S. patent application Ser. No. 09/571,109, entitled "Ultra-Broadband UV Microscope Imaging System with Wide Range Zoom Capability," filed on May 15, 2000, now U.S. Pat. No. 6,483,638, which is a continuation in part of U.S. patent application Ser. No. 09/046,814, entitled "High NA System for Multiple Mode Imaging," filed on Mar. 24, 1998, now U.S. Pat. No. 6,064,517, which is a continuation in part of U.S. patent application Ser. No. 08/908,247, entitled "Ultra-Broadband UV Microscope Imaging System with Wide Range Zoom Capability," filed on Aug. 7, 1997, now U.S. Pat. No. 5,999,310, which is a continuation in part of U.S. patent application Ser. No. 08/681,528, entitled "Broad Spectrum Ultraviolet Catadioptric Imaging System," filed on Jul. 22, 1996, now U.S. Pat. No. 5,717,518, all of which are hereby incorporated by reference.

BACKGROUND OF THE INVENTION

1. Field of the Invention

This invention relates generally to an ultra-broadband ultraviolet (UV) catadioptric imaging microscope system, and more specifically to an imaging system that comprises a UV catadioptric objective lens group and a wide-range zooming tube lens group.

2. Description of the Related Art

Catadioptric imaging systems for the deep ultraviolet spectral region (about 0.19 to 0.30 micron wavelength) are known. U.S. Pat. No. 5,031,976 to Shafer and U.S. Pat. No. 5,488,229 to Elliott and Shafer disclose two such systems. These systems employ the Schupmann achromatic lens principle and the Offner-type field lens. Axial color and primary lateral color are corrected, but not higher order lateral color. This is the limiting aberration in these systems when a broad spectral range is covered.

The above-noted '976 Shafer patent discloses an optical system based on the Schupmann achromatic lens principle which produces an achromatic virtual image. A reflective relay then creates an achromatic real image from this virtual image. The system, reproduced here as FIG. 1, includes an aberration corrector group of lenses 101 for correcting image aberrations and chromatic variation of image aberrations, a focusing lens 103 for receiving light from the group 101 and producing an intermediate image at plane 105, a field lens 107 of the same material as the other lenses placed at the intermediate image plane 105, a thick lens 109 with a plane mirror back coating 111 whose power and position are selected to correct the primary longitudinal color of the system in conjunction with the focusing lens 103, and a spherical mirror 113 located between the intermediate image plane and the thick lens 109 for producing a final image 115. Most of the focusing power of the system is due to the spherical mirror 113 which has a small central hole near the intermediate image plane 105 to allow light form the intermediate image plane 105 to pass through to the thick lens 109. The mirror coating 111 on the back of the thick lens 109 also has a small central hole 119 to allow light focused by the spherical mirror 113 to pass through to the final image 115. While primary longitudinal (axial) color is corrected by the thick lens 109, the Offner-type field lens 107 placed at the intermediate image 105 has a positive power to correct secondary longitudinal color. Placing the field lens slightly to one side of the intermediate image 105 corrects tertiary longitudinal color. Placing the field lens slightly to one side of the intermediate image 105 corrects tertiary longitudinal color. Thus, axial chromatic aberrations are completely corrected over a broad spectral range. The system also incidentally corrects for narrow band lateral color, but fails to provide complete corrections of residual (secondary and higher order) lateral color over a broad UV spectrum. The above-noted '229 patent to Elliott and Shafer provides a modified version of the optical system of the '976 patent, which has been optimized for use in 0.193 micron wavelength high power excimer laser applications such as ablation of a surface 121' as seen in FIG. 2. This prior art system has an aberration corrector group 101', focusing lens 103', intermediate focus 105', field lens 107', thick lens 109', mirror surfaces 111' and 113' with small central opening 117' and 119' therein and a final focus 115' as in the prior '976 patent, but repositions the field lens 107' so that the intermediate image or focus 105' lies outside of the field lens 107' to avoid thermal damage from the high power densities produced by focusing the excimer laser light. Further, both mirror surfaces 111' and 113' are formed on lens elements 108' and 109'. The combination of all light passing through both lens elements 108' and 109' provides the same primary longitudinal color correction of the single thick lens 109 in FIG. 1, but with a reduction in total glass thickness. Since even fused silica begins to have absorption problems at the very short 0.193 micron wavelength, the thickness reductions is advantageous at this wavelength for high power levels. Though the excimer laser source used for this optical system has a relatively narrow spectral line width, the dispersion of silica near the 0.193 micron wavelength is great enough that some color correction is still needed. Both prior art systems have a numerical aperture of about 0.6.

Longitudinal chromatic aberration (axial color) is an axial shift in the focus position with wavelength. The prior art system seen in FIG. 1 completely corrects for primary, secondary and tertiary axial color over a broad wavelength band in the near and deep ultraviolet (0.2 micron to 0.4 micron region). Lateral color is a change in magnification or image size with wavelength, and is not related to axial color. The prior art system of FIG. 1 completely corrects for primary lateral color, but not for residual lateral color. This is the limiting aberration in the system when a broad spectral range is covered.

U.S. patent application Ser. No. 08/681,528, filed Jul. 22, 1996, now U.S. Pat. No. 5,717,518, is for a catadioptric UV imaging system with performance improved over the systems of the above-describe patents. This system employs anachromatized field lens group to correct for secondary and higher order lateral color, which permits designing a high NA, large field, ultra-broadband UV imaging system.

Zooming systems in the visible wavelengths are well-known. They either do not require very high levels of correction of higher-order color effects over a broad spectral region, or do require correction, but accomplish this by using three or more glass types. In the deep UV, there are very few materials that can be used for chromatic aberration correction, making the design of high performance, broadband optics difficult. It is even more difficult to correct for chromatic aberrations for ultra-broadband optics with wide-range zoom.

There remains, therefore, a need for an ultra-broadband UV microscope imaging system with wide-range zoom capability.

SUMMARY OF THE INVENTION

The present invention has an object to provide a catadioptric imaging system which corrects for image aberrations, chromatic variation of image aberrations, longitudinal (axial) color and lateral color, including residual (secondary and higher order) lateral color correction over an ultra-broad spectral range in the near and deep UV spectral band (0.2 to 0.4 micron).

Another object is to provide an UV imaging system, useful as a microscope or as micro-lithography optics, with a large numerical aperture of 0.9 and with a field of view of at least one millimeter. The system is preferably telecentric.

The invention is a high performance, high numerical aperture, ultra-broad spectral region catadioptric optical system with zooming capability, comprising an all-refractive zooming tube lens section with one collimated conjugate, constructed so that during zooming its higher-order chromatic aberrations (particularly higher-order lateral color) do not change; and a non-zooming high numerical aperture catadioptric objective section which compensates for the uncorrected (but stationary during zoom) higher-order chromatic aberration residuals of the zooming tube lens section.

These and other objects and advantages of the present invention will become apparent to those skilled in the art from the following detailed description and accompanying drawings.

DETAILED DESCRIPTION OF THE INVENTION

Figure 1:
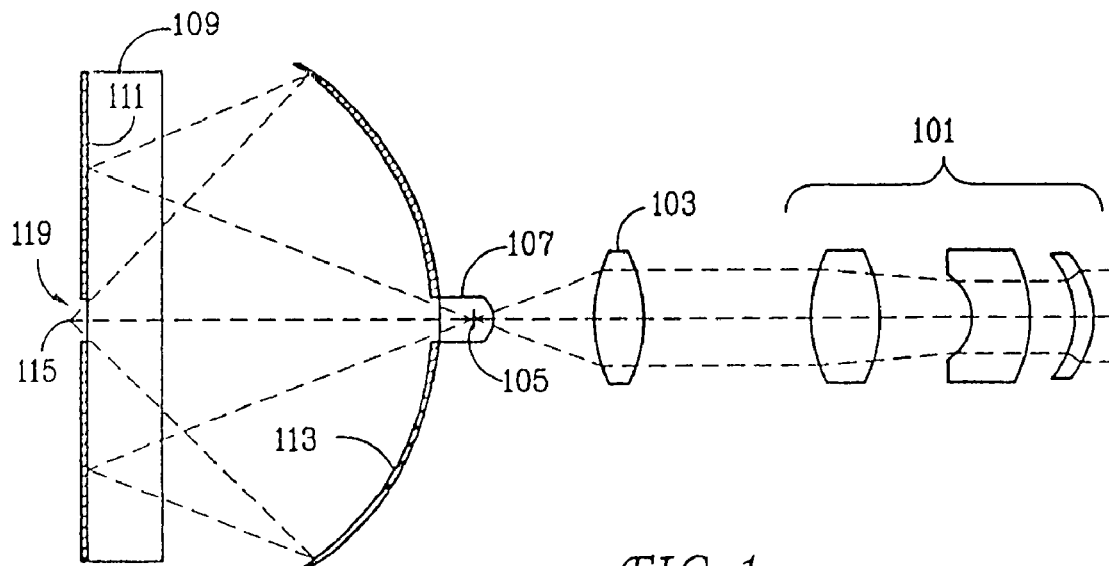
FIG. 1 is a prior art system that completely corrects for primary, secondary and tertiary axial color over a broad wavelength band in the near and deep ultraviolet (0.2 micron to 0.4 micron), but not for residual lateral color.
Figure 2:
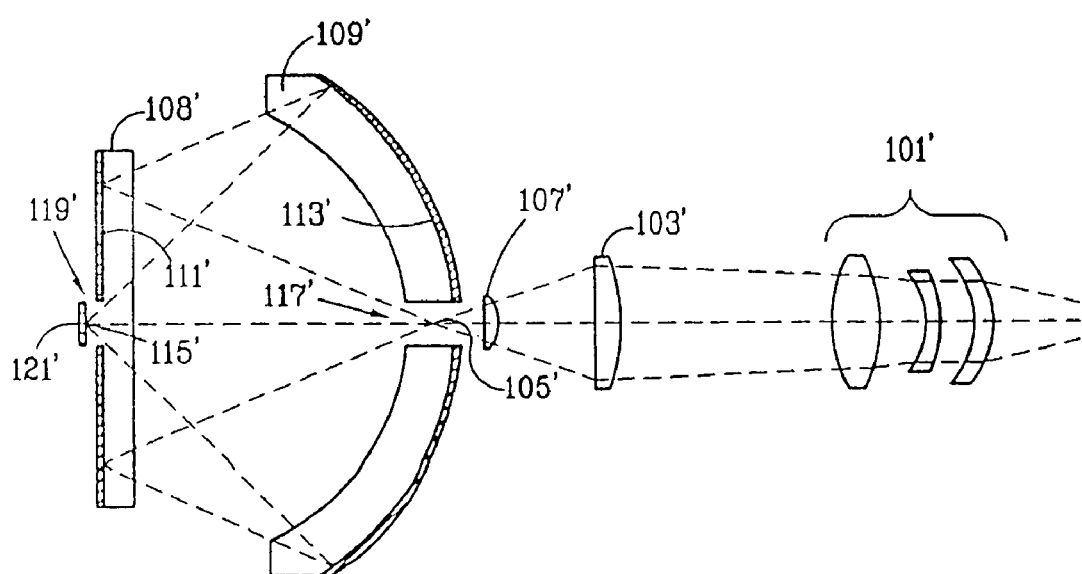
FIG. 2 is a modified version of the '976 Shafer patent optimized for use in 0.193 micron wavelength high power excimer laser applications.
Figure 3:
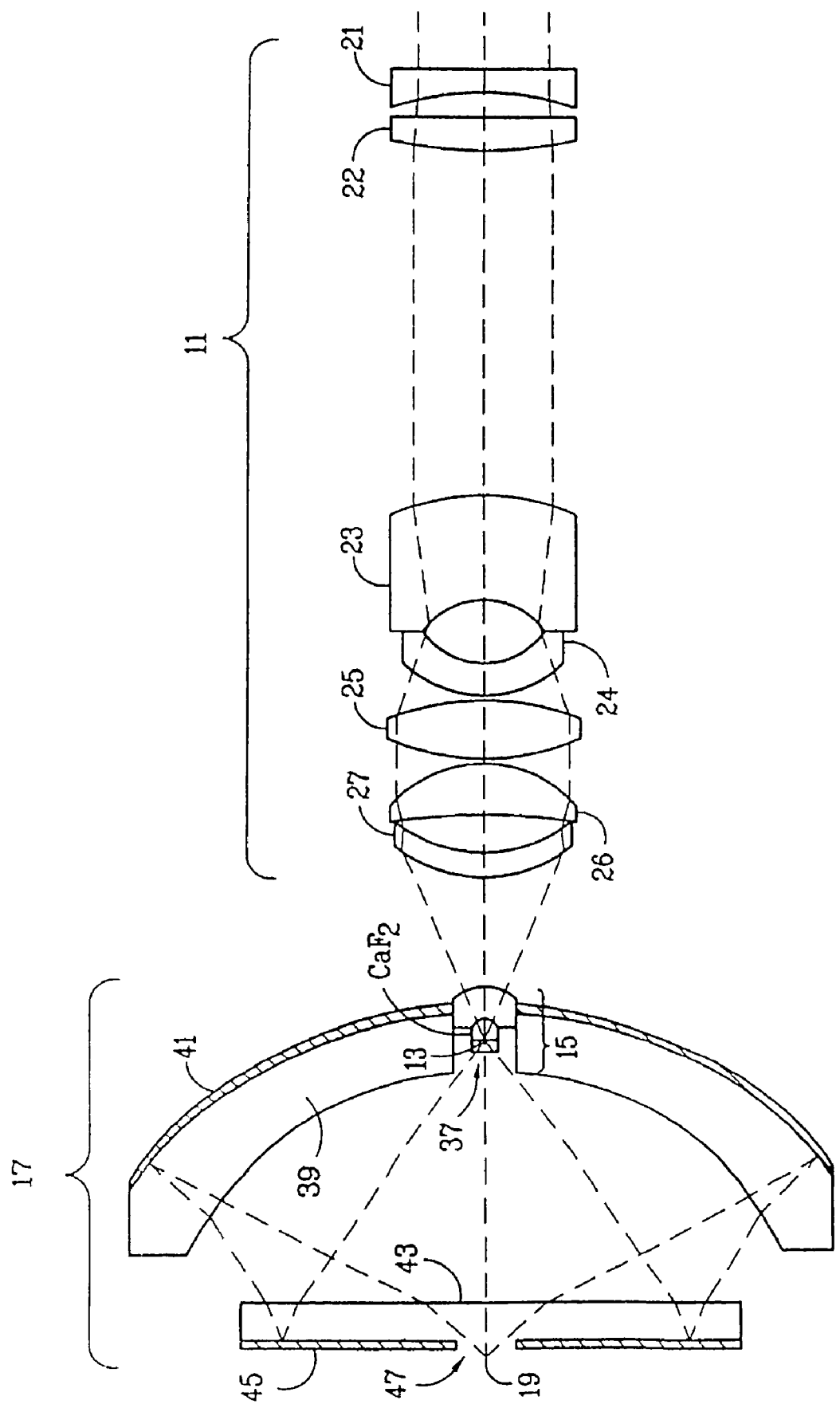
FIG. 3 is a schematic side view of a catadioptric imaging system in accord with the parent application.

FIG. 3 shows a catadioptric imaging system of the parent invention, which is especially suited for use in broadband deep ultraviolet applications and is made up of a focusing lens group 11 for forming an intermediate image 13, a field lens group 15 disposed proximate to the intermediate image 13 for correcting chromatic aberrations, and a catadioptric group 17 for focusing light from the intermediate image 13 to a final image 19. The imaging system is optimized to correct both monochromatic (Seidel) aberrations and chromatic aberrations (longitudinal and lateral), as well as chromatic variations of the monochromatic aberrations, over a wavelength band that extends into the deep ultraviolet (UV) portion of the spectrum, covering 0.20 to 0.40 micron UV light. The catadioptric system of the parent invention can be adapted for a number of UV imaging applications, including as a UV microscope objective, a collector of surface scattered UV light in a wafer inspection apparatus, or as mask projection optics for a UV photolithography system.

The focusing lens group 11 in FIG. 3 consists of seven lens elements 21-27, with two of the lens elements (21 and 22) separated by a substantial distance from the remaining five lens elements (23-27). The separations of the pair of lens elements 21 and 22 from the remaining five lens elements 23-27 is typically on the order of at least one-half the total combined thickness of the five lens elements 23-27. For example, lens elements 23-27 may span a distance of about 60 millimeters (mm) and lens element 22 may be 30 to 60 mm from lens element 23. The actual dimensions depend on the scale chosen for the embodiment. The two lenses 21 and 22 form a low power doublet for correcting chromatic variation of monochromatic image aberrations, such as coma and astigmatism. By having this doublet 21 and 22 relatively far from the other system components, the shift of the light beam with field angles on these two lenses is maximized. That in turn helps greatly in achieving the best correction of chromatic variation of aberrations.

The five lenses 23-27 of the main focusing subgroup consist of a thick strong negative meniscus lens 23, an opposite-facing strongly-curved negative meniscus lens 24, a strong bi-convex lens 25, a strong positive meniscus lens 26, and an opposite-facing strongly-curved, but very weak, meniscus lens 27 of either positive or negative power. Variations of this lens 23-27 subgroup are possible. The subgroup focuses the light to an intermediate image 13. The curvature and positions of the lens surfaces are selected to minimize monochromatic aberrations and to cooperate with the doublet 21-22 to minimize chromatic variations of those aberrations.

The field lens group 15 typically comprises an achromatic triplet, although any achromatized lens group can be used. Both fused silica and $CaF_2$ glass materials are used. Other possible deep UV transparent refractive materials can include $MgF_2$, $SrF_2$, $LaF_3$ and LiF glasses, or mixtures thereof. In addition to refractive materials, diffractive surfaces can be used to correct chromatic aberrations. Because the dispersions between the two UV transmitting materials, $CaF_2$ glass and fused silica, are not very different in the deep ultraviolet, the individual components of the group 15 have strong curvatures. Primary color aberrations are corrected mainly by the lens elements in the catadioptric group 17 in combination with the focusing lens group 11. Achromatization of the field lens group 15 allows residual lateral color to be completely corrected.

The catadioptric group 17 of FIG. 3 includes a fused silica meniscus lens 39 with a back surface having coating 41, and fused silica lens 43 with a back surface having a reflective coating 45. The two lens elements 39 and 43 front surfaces face each other. The reflective surface coating 41 and 45 are typically aluminum, possibly with a dielectric overcoat to enhance reflectivity.

The first lens 39 has a hole 37 centrally formed therein along the optical axis of the system. The reflective coating 41 likewise ends at the central hole 37 leaving a central optical aperture through which light can pass unobstructed by either the lens 39 or its reflective coating 41. The optical aperture defined by the hole 37 is in the vicinity of the intermediate image plane 13 so that there is minimum optical loss. The achromatic field lens group 15 is positioned in or near the hole 37. The second lens 43 does not normally have a hole, but there is a centrally located opening or window 47 where the coating is absent on the surface reflective coating 45. The optical aperture in lens 39 with its reflective coating 41 need not be defined by a hole 37 in the lens 39, but could be defined simply by a window in the coating 41 as in coating 45. In that case, light would pass one additional time through the refractive surfaces of lens 39.

Light from the source transmitted along the optical axis toward the intermediate image plane 13 passes through the optical aperture 37 in the first lens 39 and then through the body of the second lens 43 where it is reflected by the near planar (or planar) mirror coating 45 back through the body of the second lens 43. The light then passes through the first lens 39, is reflected by the mirror surface 41 and passes back through the first lens 39. Finally the light, now strongly convergent passes through the body of the second lens 43 for a third time, through the optical aperture 47 to the target image plane adjacent aperture 47. The curvatures and positions of the first and second lens surfaces are selected to correct primary axial and lateral color in conduction with the focal lens group 11.

For a flexible deep UV microscope system, it is important to provide various magnifications, numerical apertures, field sizes, and colors. In principle, an UV microscope system can comprise several catadioptric objectives, tube lenses, and zoom lenses. However, several problems are encountered when designing a complete microscope system. First, the microscope design needs to accommodate many large size catadioptric objectives to provide different magnifications and numerical apertures. Second, in order to maintain image quality, chromatic variation of aberrations of each tube lens must be corrected to the same degree as the objective itself. Third, the chromatic variation of aberrations of a zooming system must be corrected over the full range of zoom. These problems are addressed by the present invention.

Figure 4:
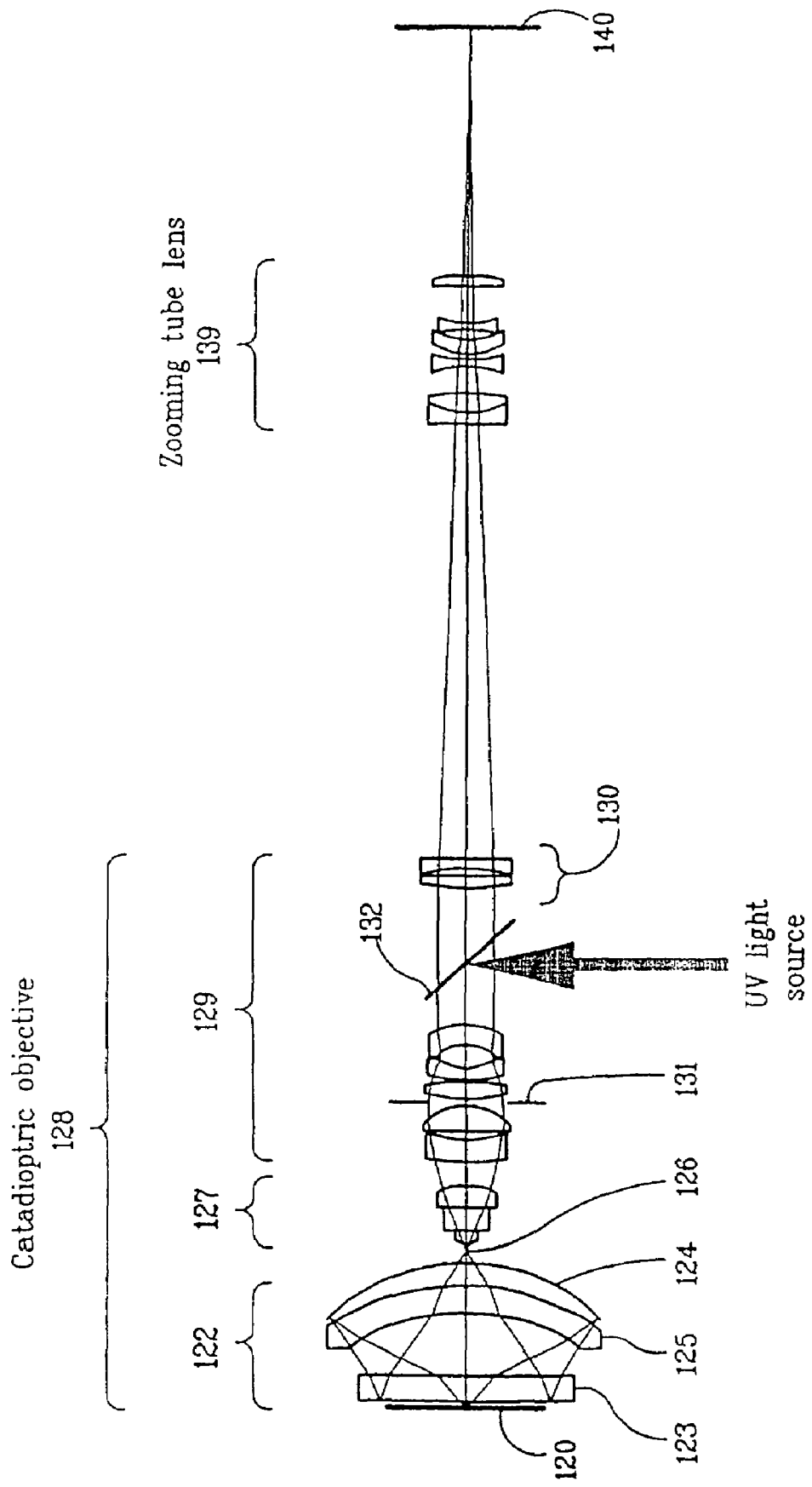
FIG. 4 is a schematic side view of a catadioptric imaging system in accordance with the present invention.

An ultra-broadband UV microscope imaging system according to the present invention as illustrated in FIG. 4 comprises a catadioptric objective section 128 and a zooming tube lens group sections 139. The catadioptric objective section 128 comprises a catadioptric lens group 122, a field lens group 127, a focusing lens group 129. The beam splitter 132 provides an entrance for the UV light source. The aperture stop 131 is used to adjust the system imaging numerical aperture (NA). The microscope system images an object 120 (e.g., a wafer being inspected) to the image plane 140. The complete 0.9 NA catadioptric objective section 128 is also described in the parent patent application.

The catadioptric objective section 128 is optimized for ultra-broadband imaging in the UV spectral region (about 0.20 to 0.40 micron wavelength). It has excellent performance for high numerical apertures and large object fields. This invention uses the Schupmann principle in combination with an Offner field lens to correct for axial color and first order lateral color, and an achromatized field lens group to correct the higher order lateral color. The elimination of the residual higher order chromatic aberrations makes the ultra-broadband UV objective design possible.

The catadioptric lens group 122 includes a near planar or planar reflector 123, which is a reflectively coated lens element, a meniscus lens 125, and a concave spherical reflector. Compared to the reflectively coated lens element 39 in FIG. 3, the preferred embodiment uses a concave reflector 124 and a large meniscus lens 125 to simplify manufacturing. Both reflective elements have central optical apertures without reflective material to allow light from the intermediate image plane 126 to pass through the concave reflector, be reflected by the near planar (or planar) reflector 123 onto the concave reflector 124, and pass back through the near planar (or planar) reflector 123, traversing the associated lens element or elements on the way.

The achromatic multi-element field lens group 127 is made from two or more different refractive materials, such as fused silica and fluoride glass, or diffractive surfaces. The field lens group 127 may be optically coupled together or alternatively may be spaced slightly apart in air. Because fused silica and fluoride glass do not differ substantially in dispersion in the deep ultraviolet range, the individual powers of the several component element of the field lens group need to be of high magnitude. Use of such an achromatic field lens allows the complete correction of axial color and lateral color over an ultra-broad spectral range. In the simplest version of the design, only one field lens component need be of a refractive material different than the other lenses of the system. Compared to group 15 in FIG. 3, the field lens group 127 is moved slightly from the intermediate image location to reduce the heat load and surface scattering of the field lens group.

The present invention has a focusing lens group 129 with multiple lens elements, preferably all formed from a single type of material, with refractive surfaces having curvatures and positions selected to correct both monochromatic aberrations and chromatic variation of aberrations and focus light to an intermediate image. In the focusing lens group 129 a special combination of lenses 130 with low power corrects the system for chromatic variation in spherical aberration, coma, and astigmatism.

Design features of the field lens group 127 and the low power group 130 are key to the present invention. The zooming tube lens 139 combined with the catadioptric objective 128 provides many desirable features. Such an all-refractive zooming lens ideally will allow the detector array 140 to be stationary during zooming, although the invention is not limited to this preferred embodiment. Assuming that the catadioptric objective system 128 does not also have any zooming function, there are two design possibilities open to the zooming tube lens system 139.

First, the zooming section 139 can be all the same refractive material, such as fused silica, and it must be designed so that primary longitudinal and primary lateral color do not change during zooming. These primary chromatic aberrations do not have to be corrected to zero, and cannot be if only one glass type is used, but they have to be stationary, which is possible. Then the design of the catadioptric objective 128 must be modified to compensate for these uncorrected but stationary chromatic aberrations of the zooming tube lens. This can be done, but a solution is needed with good image quality. Despite the limited image quality, this design possibility is very desirable since the whole combined microscope system is a single material, i.e., fused silica, except for the calcium fluoride or a diffractive surface in the achromatized Offner-type field lens.

Second, the zooming tube lens group 139 can be corrected for aberrations independently of the catadioptric objective 128. This requires the use of at least two refractive materials with different dispersions, such as fused silica and calcium fluoride, or diffractive surfaces. Unfortunately, the result is a tube lens system that, because of unavoidable higher-order residuals of longitudinal and lateral color over the entire zoom range, is not capable of high performance over a very broad UV spectral region. Compromises must then be made in the form of reducing the spectral range, the numerical aperture, the field size of the combined system, or some combination of these compromises. The result is that the very high capabilities of the catadioptric objective cannot be duplicated with an independently corrected zooming tube lens.

The present invention straddles the two situations just described. The zooming tube lens 139 is first corrected independently of the catadioptric objective 128, using two refractive materials (such as fused silica and calcium fluoride). Lens 139 is then combined with the catadioptric objective 128 and then the catadioptric objective is modified to compensate for the residual higher-order chromatic aberrations of the zooming tube lens system. This is possible because of the design features of the field lens group 127 and the low power lens group 130 of the catadioptric objective described earlier. The combined system is then optimized with all parameters being varied to achieve the best performance.

One unique feature of the present invention is the particular details of the zooming tube lens. If the higher-order residual chromatic aberrations of this zooming system change during zoom, then the catadioptric objective cannot exactly compensate for them except at one zoom position. It is easy to design a zooming tube lens system where the low-order chromatic aberrations do not change during zoom, and are corrected to zero as well. But it is very difficult to find a zooming tube lens design where the higher-order chromatic aberration residuals (which are uncorrectable to zero, in that system by itself) do not change during the zooming.

A tube lens section can be designed such that its higher-order chromatic aberrations do not change by any significant amount during zoom. If the detector array 140 is allowed to move during zoom, then the design problem becomes much easier, but that is not nearly as desirable as having an image position fixed relative to the rest of the system.

The imaging system of the invention provides a zoom from 36× to 100× and greater, and integrates objectives, turret, tube lenses (to provide more magnifications) and zoom optics into one module. The imaging system reduces optical and mechanical components, improves manufacturability and reduces production costs. The imaging system has several performance advantages such as: high optical resolution due to deep UV imaging, reduced thin film interference effects due to ultra-broadband light, and increased light brightness due to integration of ultra-broad spectral range. The wide range zoom provides continuous magnification change. The fine zoom reduces aliasing and allows electronic image processing, such as cell-to-cell subtraction for a repeating image array. By placing an adjustable aperture in the aperture stop of the microscope system one can adjust the NA and obtain the desired optical resolution and depth of focus. The invention is a flexible system with an adjustable wavelength, an adjustable bandwidth, an adjustable magnification, and an adjustable numerical aperture.

There are three possible embodiments of zoom lenses. The first embodiment provides linear zoom motion with a fixed detector array position. The second embodiment provides linear zoom motion with a moving detector array position. The third embodiment, in addition to zoom lenses, utilizes folding mirrors to reduce the physical length of the imaging system and fix the detector array position.

Figure 5:
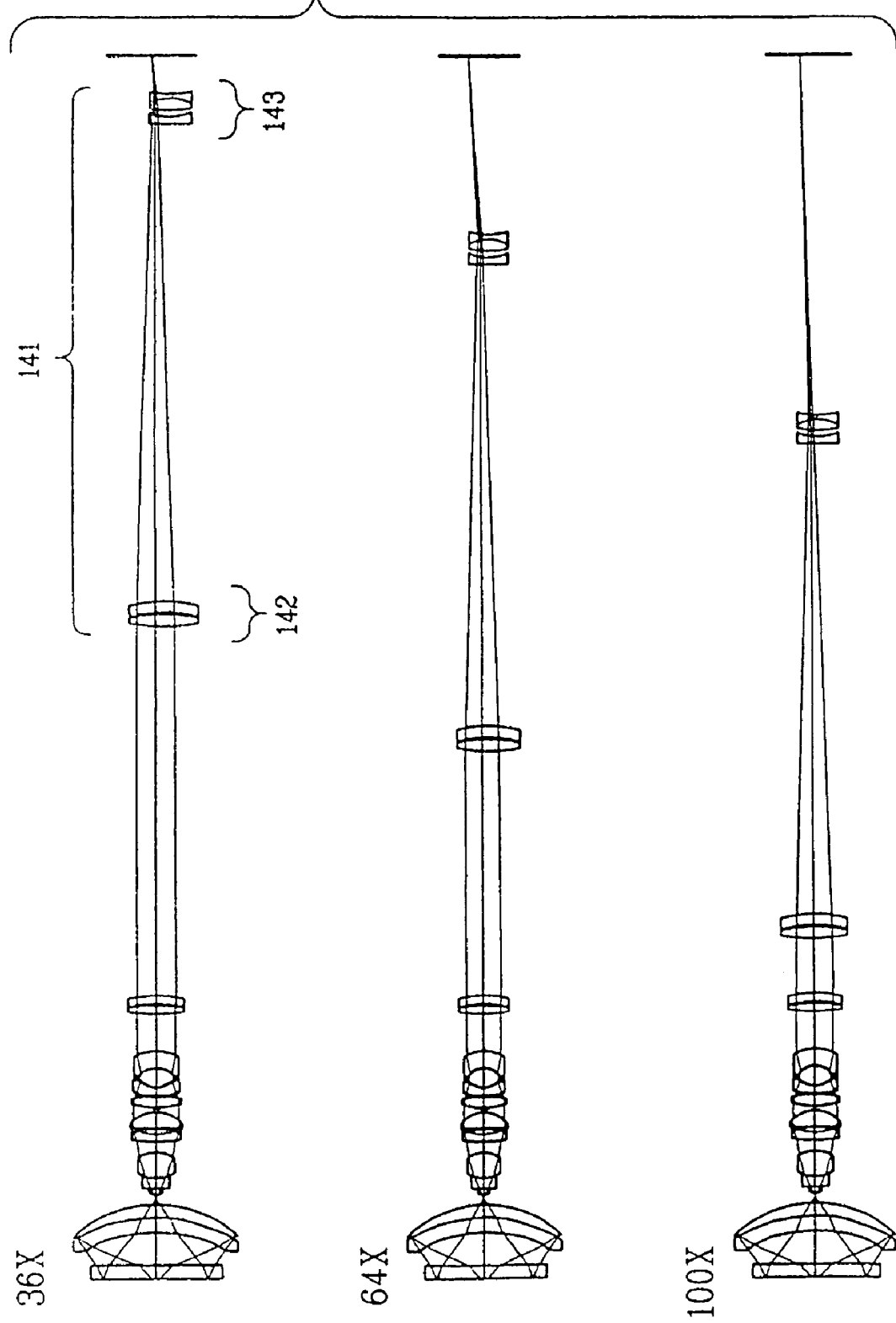
FIG. 5 is schematic side view of a catadioptric imaging system in the three positions having 36×,64×, and 100× power magnifications in accordance with a first embodiment of the invention.

The first embodiment of zoom lenses provides linear zoom motion with a fixed detector array position. FIG. 5 shows the 36× zoom arrangement of the lenses, the 64× zoom arrangement of the lenses and the 100× zoom arrangement of the lenses. The detector array 140 (not shown) is fixed. The zooming tube lens design 141 is comprised of two moving lens groups 142 and 143. The beam splitter is not shown in this and later figures for the purpose of clarity. The following table lists the surfaces shown in FIG. 5, where the surface numbering begins at "0" for the final image counting towards the object being inspected.

Lens Data for the First Embodiment 0.90 N.A., fixed detector, 36×-100× zoom, 1.0 mm field size.

| Surface | Radius | Thickness | | Glass |
|---|---|---|---|---|
| 0 | — | 30.000000 | 36X | Air |
| | | 152.396279 | 64X | |
| | | 318.839746 | 100X | |
| 1 | −46.843442 | 4.000000 | | Calcium fluoride |
| 2 | 67.017379 | 0.999804 | | Air |
| 3 | 122.003494 | 7.000000 | | Silica |
| 4 | −34.944144 | 4.496612 | | Air |
| 5 | −42.883889 | 4.000000 | | Calcium fluoride |
| 6 | −1.5857e+03 | 339.659737 | 36X | Air |
| | | 298.114540 | 64X | |
| | | 279.997392 | 100X | |
| 7 | −657.423731 | 9.000000 | | Calcium fluoride |
| 8 | −67.124645 | 0.999689 | | Air |
| 9 | −70.484550 | 6.000000 | | Silica |
| 10 | 102.732012 | 28.382549 | | Air |
| 11 | 170.942101 | 13.000000 | | Calcium fluoride |
| 12 | −126.768482 | 274.177371 | 36X | Air |
| | | 193.326289 | 64X | |
| | | 44.999970 | 100X | |
| 13 | 103.846671 | 5.000000 | | Silica |
| 14 | 57.151413 | 3.500000 | | Air |
| 15 | 113.406488 | 7.000000 | | Silica |
| 16 | −149.254887 | 58.301706 | | Air |
| 17 | 41.730749 | 14.904897 | | Silica |
| 18 | 17.375347 | 11.364798 | | Air |
| 19 | −22.828011 | 5.892666 | | Silica |
| 20 | −57.773872 | 1.000000 | | Air |
| 21 | 174.740180 | 7.000000 | | Silica |
| 22 | −48.056749 | 4.000000 | | Air |
| 23 | 24.023380 | 11.500000 | | Silica |
| 24 | −1.0394e+03 | 4.198255 | | Air |
| 25 | −43.531092 | 5.000000 | | Silica |
| 26 | −197.030499 | 1.000000 | | Air |
| 27 | 45.618003 | 29.827305 | | Silica |
| 28 | −81.744432 | 1.662262 | | Air |
| 29 | 17.258988 | 4.000000 | | Calcium fluoride |
| 30 | −31.010978 | 0.315372 | | Air |
| 31 | −24.055515 | 2.000000 | | Silica |
| 32 | 5.602559 | 0.020000 | | Air |
| 33 | 5.602559 | 8.318486 | | Calcium fluoride |
| 34 | −24.871116 | 7.710304 | | Air |
| 35 | — | 8.328925 | | Air |
| Aperture Stop | | | | |
| 36 | 85.000000 | 11.000000 | | Silica |
| 37 | 70.542512 | 29.938531 | | Air |
| 38 | 1.6514e+03 | 10.000000 | | Silica |
| 39 | Infinity | −10.000000 | | Reflect |
| 40 | 1.6514e+03 | −29.938531 | | Air |
| 41 | 70.542512 | −11.000000 | | Silica |
| 42 | 85.000000 | −8.328925 | | Air |
| 43 | 74.648515 | 8.328925 | | Reflect |
| 44 | 85.000000 | 11.000000 | | Silica |
| 45 | 70.542512 | 29.938531 | | Air |
| 46 | 1.6514e+03 | 10.000000 | | Silica |
| 47 | Infinity | 1.500000 | | Air |

Figure 6:
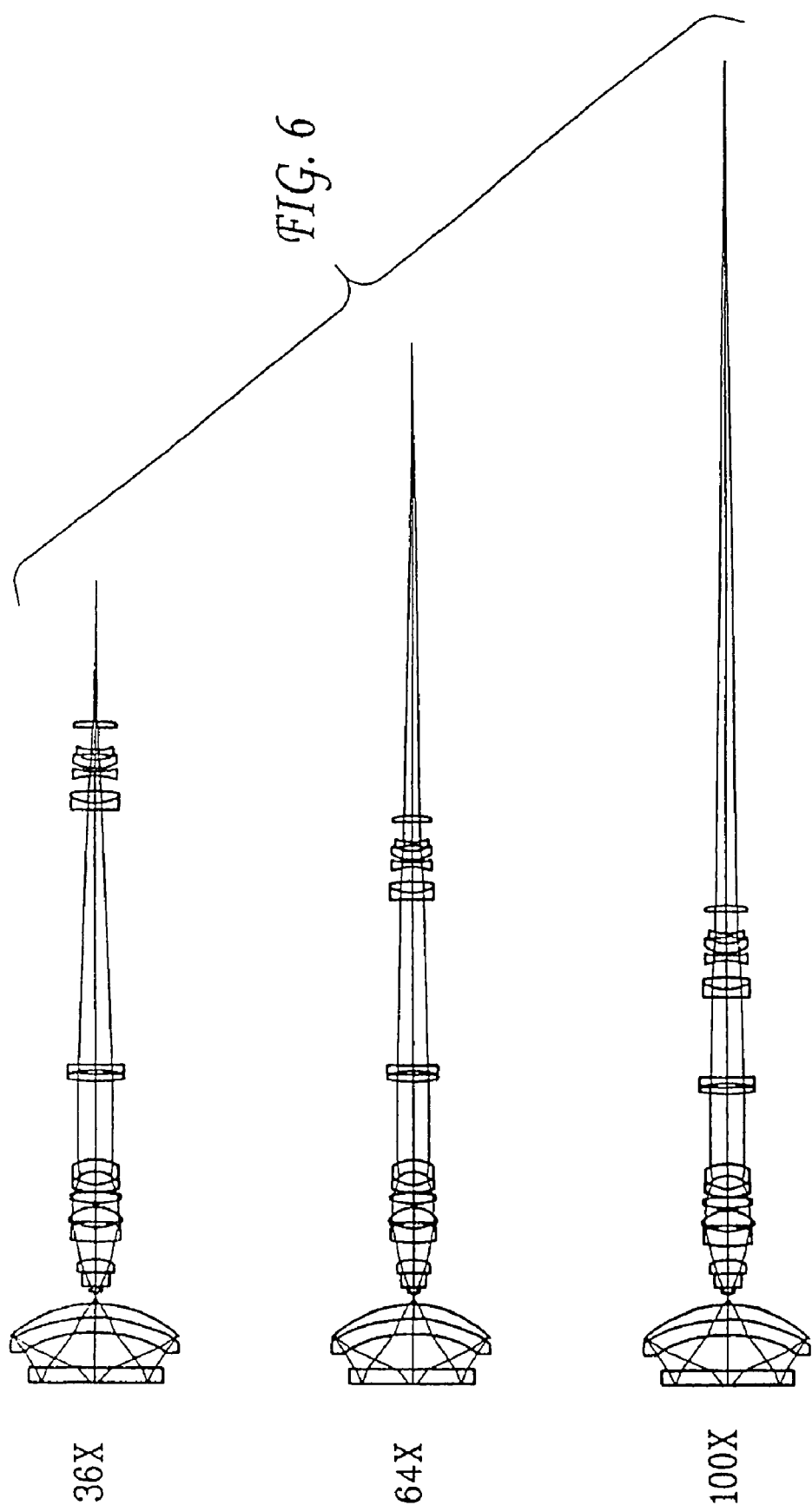
FIG. 6 is a schematic side view of a catadioptric imaging system in three positions having 36×,64×, and 100× power magnifications in accordance with a second embodiment of invention.

The second embodiment of zoom lenses provides linear zoom motion with a moving detector array position and FIG. 6 shows the 36× zoom arrangement of the lenses, the 64× zoom arrangement of the lenses and the 100× zoom arrangement of the lenses. The following table lists the surfaces shown in FIG. 6, where the surface numbering begins at "0" for the final image incrementing by 1 towards the object being inspected.

Lens Data for the Second Embodiment 0.90 N.A., moving detector, 36×-100× zoom, 1.0 mm field size

| SURFACE | RADIUS | THICKNESS | | GLASS |
|---|---|---|---|---|
| 0 | Infinity | 110.004950 | 36X | Air |
|   |          | 405.371660 | 64X |     |
|   |          | 785.131189 | 100X |    |
| 1 | 73.156621 | 5.000000 | | Calcium fluoride |
| 2 | −609.638437 | 18.230155 | | Air |
| 3 | −30.303090 | 3.500000 | | Calcium fluoride |
| 4 | 44.361656 | 4.000000 | | Air |
| 5 | −51.318999 | 7.765282 | | Silica |
| 6 | −23.231195 | 1.564401 | | Air |
| 7 | −119.756315 | 4.000000 | | Calcium fluoride |
| 8 | 40.002701 | 12.019418 | | Air |
| 9 | 54.594789 | 10.000000 | | Calcium fluoride |
| 10 | −28.923744 | 0.100000 | | Air |
| 11 | −29.957411 | 5.000000 | | Silica |
| 12 | −156.281481 | 202.434836 | 36X | Air |
|    |             | 108.230318 | 64X |     |
|    |             | 64.650627 | 100X |    |
| 13 | 188.664770 | 4.500000 | | Silica |
| 14 | 56.034008 | 3.500000 | | Air |
| 15 | 214.395300 | 6.000000 | | Silica |
| 16 | −79.842174 | 62.685096 | | Air |
| 17 | 29.721624 | 10.000000 | | Silica |
| 18 | 18.529920 | 11.406390 | | Air |
| 19 | −23.406055 | 5.864347 | | Silica |
| 20 | −46.076628 | 1.000000 | | Air |
| 21 | 94.310969 | 7.000000 | | Silica |
| 22 | −75.041727 | 4.000000 | | Air |
| 23 | 23.509091 | 11.500000 | | Silica |
| Aperture Stop | | | | |
| 24 | −399.710365 | 4.516455 | | Air |
| 25 | −42.987793 | 10.000000 | | Silica |
| 26 | −217.407455 | 12.083912 | | Air |
| 27 | 24.940148 | 10.000000 | | Calcium fluoride |
| 28 | −177.604306 | 0.100000 | | Air |
| 29 | 24.508018 | 10.000000 | | Calcium fluoride |
| 30 | −54.909641 | 0.664880 | | Air |
| 31 | −16.389836 | 2.000000 | | Silica |
| 32 | 4.296836 | 0.020000 | | Air |
| 33 | 4.296836 | 3.000000 | | Calcium fluoride |
| 34 | −14.014264 | 7.000000 | | Air |
| 35 | — | 11.160093 | | — |
| Internal image | | | | |
| 36 | 102.631452 | 11.000000 | | Silica |
| 37 | 84.741293 | 27.845569 | | Air |
| 38 | 1.1470e+03 | 10.000000 | | Silica |
| 39 | Infinity | −10.000000 | | Reflect |
| 40 | 1.1470e+03 | −27.845569 | | Air |
| 41 | 84.741293 | −11.000000 | | Silica |
| 42 | 102.631452 | −11.160093 | | Air |
| 43 | 75.033466 | 11.160093 | | Reflect |
| 44 | 102.631452 | 11.000000 | | Silica |
| 45 | 84.741293 | 27.845569 | | Air |
| 46 | 1.1470e+03 | 10.000000 | | Silica |
| 47 | Infinity | 1.500000 | | Air |

Figure 7:
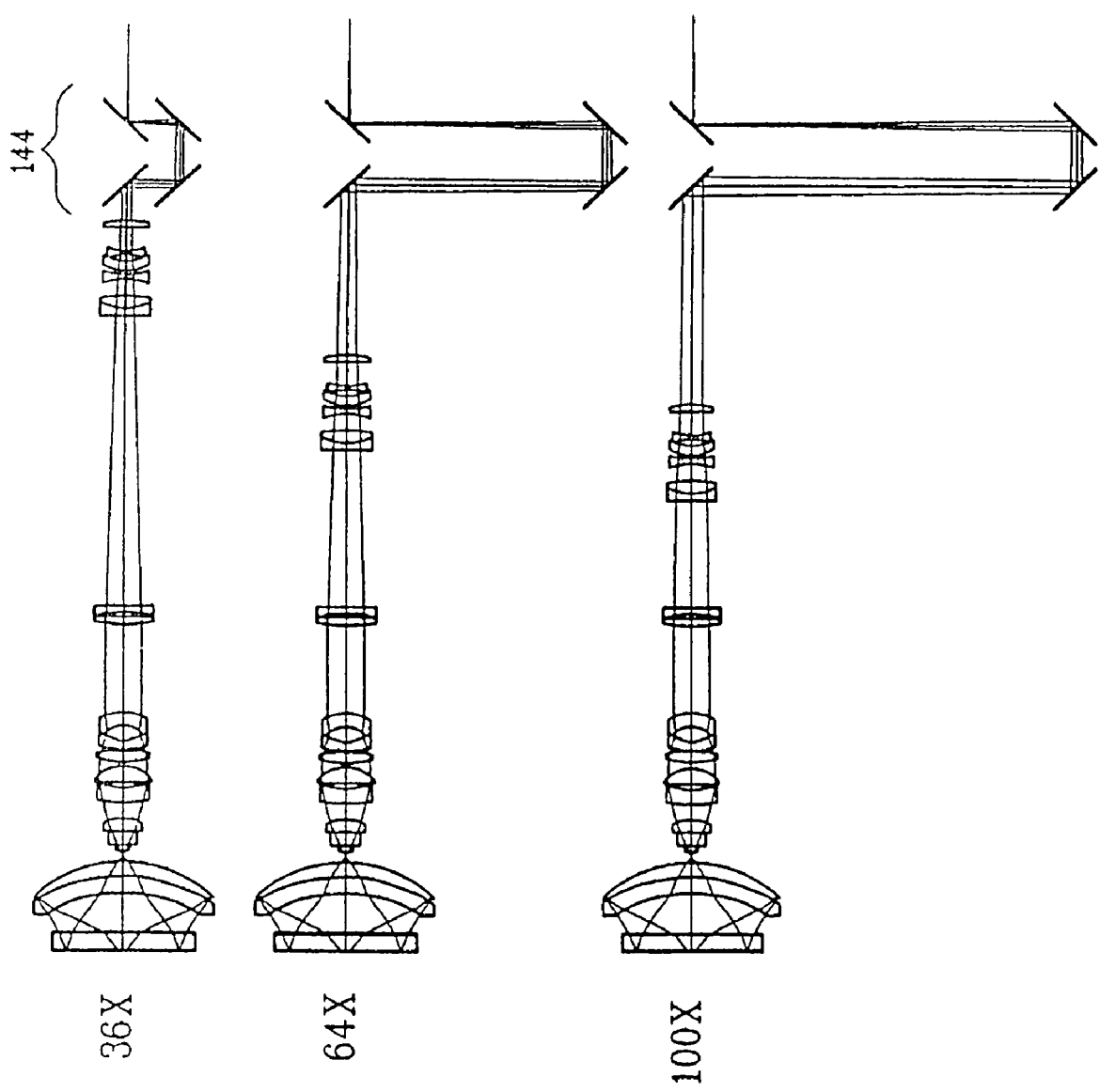
FIG. 7 is a schematic side view of a catadioptric imaging system in three positions having 36×,64×, and 100× power magnification in accordance with a third embodiment of the invention.

The third embodiment of zoom lenses provides linear zoom motion with a fixed sensor position by using the same lens design as the second embodiment and incorporating a "trombone" system of reflective elements so that the detector array does not move. FIG. 7 shows the 36× zoom arrangement of the lenses and reflective elements, the 64× zoom arrangement of the lenses and reflective elements and the 100× zoom arrangement of the lenses and reflective elements. The folding mirror group 144 is the "trombone" system of reflective elements. This folding mirror arrangement is just one example. Many other arrangements are possible, such as, using a different number of reflective elements.

Module Transfer Function curves (not shown) indicate that the FIG. 7 embodiment is essentially perfect at 64× and 100×, and is good at 36×. Zooming is done by moving a group of 6 lenses, as a unit, and also moving the arm of the trombone slide. Since the trombone motion only affects focus and the f# speed at location is very slow, the accuracy of this motion could be very loose. One advantage of the trombone embodiment is that it significantly shortens the system. Another advantage is that there is only one zoom motion that involves active (non-flat) optical elements. And the other zoom motion, with the trombone slide, is insensitive to errors.

Figure 8:
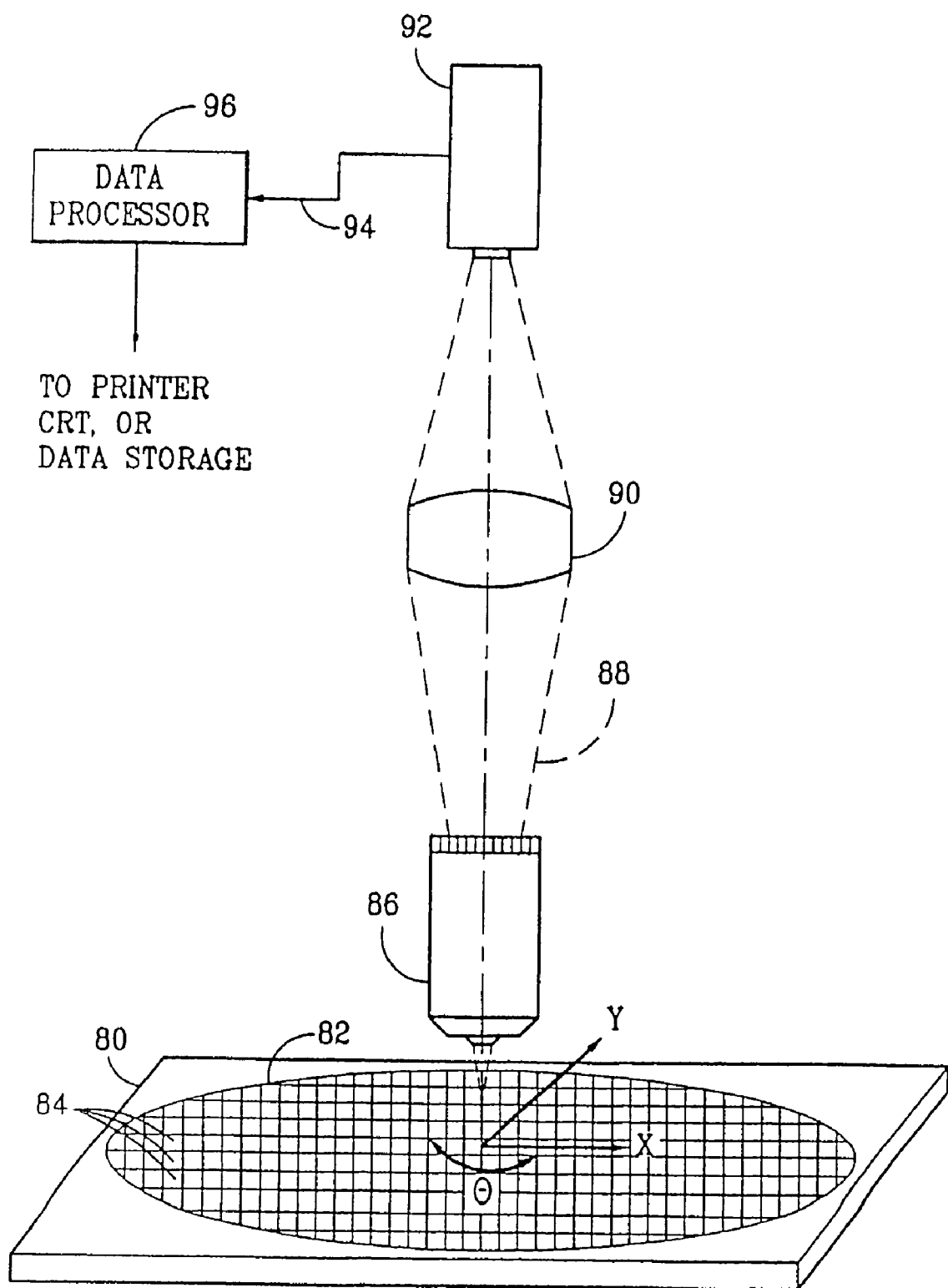
FIG. 8 is a schematic side view of a zooming catadioptric imaging system in an application for the inspection of semiconductor wafers.

FIG. 8 is a schematic side view of a catadioptric imaging system with a zoom in an application for the inspection of semiconductor wafers. Platform 80 holds a wafer 82 that is composed of several integrated circuit dice 84. The catadioptric objective 86 transfers the light ray bundle 88 to the zooming tube lens 90 which produces an adjustable image received by the detector 92. The detector 92 converts the image to binary coded data and transfers the data over cable 94 to data processor 96.

The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. An optical system comprising:
   a plurality of focusing lenses collectively configured to correct the optical system for chromatic variations in spherical aberration, coma, and astigmatism, each focusing lens having lens curvatures selected to focus ultraviolet light at an intermediate image;
   a field lens arrangement aligned proximate to said intermediate image having field lenses with lens curvatures selected to provide correction of at least second order lateral chromatic aberrations, said field lens arrangement comprising one field lens formed from a first refractive material and at least one additional field lens formed from a second refractive material and
   a catadioptic relay lens arrangement comprising lenses having curvatures selected to form a real image of said intermediate image.

2. The optical system of claim 1, wherein primary longitudinal color and chromatic aberrations of the optical system are substantially corrected over a wavelength band including at least one wavelength in the UV range.

3. The optical system of claim 2, wherein the plurality of focusing lenses provides relatively high levels of correction of both image aberrations and chromatic variation of aberrations over the wavelength band simultaneous to focusing ultraviolet light at an intermediate image within the system.

4. The optical system of claim 1, further comprising a zooming tube lens group having an ability to alter focus without substantially changing higher-order chromatic aberrations.

5. The optical system of claim 3, wherein at least one of the plurality of focusing lenses, field lens arrangement, and catadioptric relay lens arrangement substantially compensates over said wavelength band for uncorrected, but stationary higher-order chromatic aberration residuals of the zooming tube lens group.

6. The optical system of claim 4 wherein said zooming tube lens group can zoom without substantially changing higher-order chromatic aberrations.

7. The optical system of claim 4, wherein said field lens arrangement comprises a plurality of lens elements formed from at least two different refractive materials having different dispersions.

8. The optical system of claim 1, wherein said field lens arrangement provides a net positive power.

9. The optical system of claim 1, wherein the field lens arrangement comprises a plurality of lens elements with different dispersions.

10. An optical system comprising:
    a plurality of focusing lenses configured to correct the optical system for chromatic variations in spherical aberration, coma, and astigmatism having refractive surfaces positioned to focus ultraviolet light at an intermediate image;
    a field lens arrangement aligned proximate to said intermediate image, wherein field lenses in the field lens arrangement are selected to provide substantial correction of at least secondary longitudinal color and primary and secondary lateral color of the system, said field lens arrangement comprising one field lens formed from a first refractive material and at least one additional field lens formed from a second refractive material; and
    a catadioptric arrangement comprising at least one lens selected to form a real image of said intermediate image.

11. The optical system of claim 10, wherein primary longitudinal color of the system is substantially corrected over a wavelength band including at least one wavelength in the UV range.

12. The optical system of claim 11, wherein the plurality of focusing lenses provides relatively high levels of correction of both image aberrations and chromatic variation of aberrations over the wavelength band simultaneous to focusing ultraviolet light at the intermediate image.

13. The optical system of claim 10, further comprising:
    a tube lens group which can alter focus without changing higher-order chromatic aberrations.

14. The optical system of claim 13, wherein said tube lens group is an all-refractive zooming tube lens group configured to zoom without changing higher-order chromatic aberrations.

15. The optical system of claim 14, wherein at least one of the plurality of focusing lenses, field lens arrangement, and catadioptric arrangement substantially compensates over said wavelength band for uncorrected, but stationary higher-order chromatic aberration residuals of the zooming tube lens group.

16. The optical system of claim 13, wherein said tube lens group is an all-refractive zooming tube lens group having the ability to change magnification without changing higher-order chromatic aberrations.

17. The optical system of claim 13, wherein the tube lens group includes refractive surfaces.

18. The optical system of claim 10, wherein the field lens arrangement has a net positive power.

19. A method for constructing an optical system comprising:
    providing a plurality of focusing lens elements configured to focus ultraviolet light at an intermediate image and simultaneously to also provide correction of both image aberrations and chromatic variation of aberrations over a wavelength band including at least one wavelength in the UV range, said plurality of focusing lenses configured to correct the optical system for chromatic variations in spherical aberration, coma, and astigmatism;
    providing a field lens arrangement proximate to said intermediate image selected to provide substantial correction of chromatic aberrations including at least secondary longitudinal color and primary and secondary lateral color of the system, said field lens arrangement comprising one field lens formed from a first refractive material and at least one additional field lens formed from a second refractive material; and
    forming a real image with a catadioptric relay arrangement having components selected such that primary longitudinal color of the system is substantially corrected.

20. The method of claim 19, wherein primary longitudinal color of the system is substantially corrected over a wavelength band including at least one wavelength in the UV range.

21. The method of claim 20, wherein the providing of the field lens arrangement, providing the focusing lens elements, and forming the real image substantially corrects for chromatic variations in spherical aberration, coma, and astigmatism over said wavelength band.

22. The method of claim 19, further comprising:
    altering focus using a tube lens group able to alter focus without changing higher-order chromatic aberrations.

23. The method of claim 22, wherein the plurality of focusing lens elements, the field lens arrangement, and the catadioptric relay arrangement comprises components selected to substantially eliminate residual chromatic aberrations and thereby substantially compensate said tube lens group for higher-order chromatic aberrations.

\* \* \* \* \*